(12) United States Patent
Zaghib et al.

(10) Patent No.: US 10,381,642 B2
(45) Date of Patent: Aug. 13, 2019

(54) ANODE FOR HIGH-ENERGY BATTERIES

(71) Applicant: HYDRO-QUÉBEC, Montréal, Québec (CA)

(72) Inventors: Karim Zaghib, Longueuil (CA); Dominic Leblanc, Gentilly (CA); Abdelbast Guerfi, Brossard (CA); Julie Trottier, Mirabel (CA); Patrick Charest, Sainte-Julie (CA)

(73) Assignee: HYDRO-QUÉBEC, Montreal (CA)

( * ) Notice: Subject to any disclaimer, the term of this patent is extended or adjusted under 35 U.S.C. 154(b) by 663 days.

(21) Appl. No.: 14/900,419

(22) PCT Filed: Jun. 20, 2014

(86) PCT No.: PCT/CA2014/050585
§ 371 (c)(1),
(2) Date: Dec. 21, 2015

(87) PCT Pub. No.: WO2014/201569
PCT Pub. Date: Dec. 24, 2014

(65) Prior Publication Data
US 2016/0149212 A1    May 26, 2016

(30) Foreign Application Priority Data

Jun. 21, 2013  (CA) .................................... 2820468

(51) Int. Cl.
*H01M 4/38* (2006.01)
*H01M 4/04* (2006.01)
(Continued)

(52) U.S. Cl.
CPC ......... *H01M 4/386* (2013.01); *H01M 4/0404* (2013.01); *H01M 4/13* (2013.01);
(Continued)

(58) Field of Classification Search
CPC .... H01M 4/386; H01M 4/364; H01M 4/0404; H01M 4/13; H01M 4/134; H01M 4/1395;
(Continued)

(56) References Cited

U.S. PATENT DOCUMENTS

| 5,387,479 A | 2/1995 | Koksbang |
| 6,025,094 A | 2/2000 | Visco et al. |

(Continued)

FOREIGN PATENT DOCUMENTS

| CN | 1933214 A | 3/2007 |
| CN | 102956889 A | 3/2013 |

(Continued)

OTHER PUBLICATIONS

Lu et al., Preparation, Characterization and Electrochemical Performance of Silicon Coated Natural Graphite as Anode for Lithium Ion Batteries, Int. J. Electrochem. Sci. 7, (2012), pp. 6180-6190.

(Continued)

*Primary Examiner* — Laura Weiner
(74) *Attorney, Agent, or Firm* — Buchanan Ingersoll & Rooney P.C.

(57) ABSTRACT

Anode comprising an anode material, a protective material and a current collector is provided. The anode material is a mixture comprising an active material, at least one electronically conductive agent and at least one binder. The active material may be an alloy of silicon and lithium or an alloy of silicon oxide and lithium. There is provided a process for the preparation of the anode. Also, there is provided use of the anode in the fabrication of a battery.

14 Claims, 6 Drawing Sheets

(51) Int. Cl.

| | | |
|---|---|---|
| *H01M 4/13* | (2010.01) | |
| *H01M 4/134* | (2010.01) | |
| *H01M 4/139* | (2010.01) | |
| *H01M 4/1395* | (2010.01) | |
| *H01M 4/36* | (2006.01) | |
| *H01M 4/485* | (2010.01) | |
| *H01M 4/587* | (2010.01) | |
| *H01M 4/62* | (2006.01) | |
| *H01M 4/66* | (2006.01) | |
| *H01M 4/40* | (2006.01) | |
| *H01M 10/052* | (2010.01) | |
| *H01M 4/133* | (2010.01) | |
| *H01M 4/02* | (2006.01) | |

(52) U.S. Cl.
CPC ........... *H01M 4/134* (2013.01); *H01M 4/139* (2013.01); *H01M 4/1395* (2013.01); *H01M 4/364* (2013.01); *H01M 4/405* (2013.01); *H01M 4/485* (2013.01); *H01M 4/587* (2013.01); *H01M 4/622* (2013.01); *H01M 4/623* (2013.01); *H01M 4/625* (2013.01); *H01M 4/661* (2013.01); *H01M 4/663* (2013.01); *H01M 4/666* (2013.01); *H01M 10/052* (2013.01); *H01M 4/133* (2013.01); *H01M 2004/027* (2013.01)

(58) Field of Classification Search
CPC ...... H01M 4/587; H01M 4/622; H01M 4/623; H01M 4/625; H01M 4/661; H01M 4/663; H01M 4/405; H01M 4/666; H01M 10/052; H01M 2004/027
See application file for complete search history.

(56) References Cited

U.S. PATENT DOCUMENTS

| | | | |
|---|---|---|---|
| 6,365,299 | B1 | 4/2002 | Miyaki et al. |
| 6,589,696 | B2 | 7/2003 | Matsubara et al. |
| 6,777,134 | B2 | 8/2004 | Mori et al. |
| 7,105,251 | B2 | 9/2006 | Muyaki et al. |
| 7,327,556 | B2 | 2/2008 | Ro et al. |
| 7,629,083 | B2 | 12/2009 | Cho et al. |
| 8,257,858 | B2 | 9/2012 | Kashiwagi |
| 8,455,138 | B2 | 6/2013 | Kim et al. |
| 2003/0036000 | A1 | 2/2003 | Mori et al. |
| 2005/0136330 | A1 | 6/2005 | Mao et al. |
| 2007/0059600 | A1 | 3/2007 | Kim et al. |
| 2008/0102370 | A1 | 5/2008 | Kashiwagi |
| 2008/0193831 | A1 | 8/2008 | Mah et al. |
| 2012/0231339 | A1 | 9/2012 | Park et al. |
| 2012/0264020 | A1 | 10/2012 | Burton et al. |
| 2012/0270114 | A1 | 10/2012 | Reynolds et al. |
| 2013/0149605 | A1 | 6/2013 | Kakehata et al. |
| 2014/0065491 | A1 | 3/2014 | Yokouchi et al. |

FOREIGN PATENT DOCUMENTS

| | | |
|---|---|---|
| CN | 103022413 A | 4/2013 |
| JP | H06215775 A | 8/1994 |
| JP | H06333569 A | 12/1994 |
| JP | 200345415 A | 2/2003 |
| JP | 200780827 A | 3/2007 |
| JP | 2007294423 A | 11/2007 |
| JP | 2008117574 A | 5/2008 |
| JP | 2013 077398 A | 4/2013 |
| WO | 9701870 A1 | 1/1997 |
| WO | 2004/087984 A1 | 10/2004 |
| WO | 2012/147761 A1 | 11/2012 |

OTHER PUBLICATIONS

International Search Report (PCT/ISA/210) dated Sep. 8, 2014, by the Canadian Patent Office as the International Searching Authority for International Application No. PCT/CA2014/050585.
Office Action (Notice of Reasons for Rejection) dated Jun. 11, 2018, by the Japanese Patent Office in corresponding Japanese Patent Application No. 2016-520208 and an English Translation of the Office Action. (15 pages).
Office Action (Notification selon l'Article 94(3) CBE) dated Jul. 27, 2018, by the European Patent Office in corresponding European Application No. 14 812 961.2-1108, 5 pages.

ANODE FOR HIGH-ENERGY BATTERIES

FIELD OF THE INVENTION

The present invention relates generally to anodes for high-energy batteries. More specifically, the present invention relates to an anode for lithium battery, comprising an anode material, a protective material and a current collector.

BACKGROUND OF THE INVENTION

Batteries based on reversible circulation of lithium ions through an electrolyte containing a lithium salt are known. In this type of battery, the cathode comprises a current collector having a composite active material which generally comprises an active material allowing for the reversible insertion of lithium ions at high voltage, a binder, an electronically conductive agent and eventually an ionically conductive agent. The electrolyte is a solution of a lithium salt in a liquid solvent, a polymer solvent, or a polymer gel. And the anode comprises a lithium or lithium-based alloy film, or the anode comprises a current collector having an active material comprising a compound allowing for the reversible insertion of lithium ions at a voltage lower than the cathode, for example carbon, graphite, an oxide, or silicon.

The reversible insertion of lithium ions in the electrode material leads to a volume variation of the material. More specifically, a volume increase occurs during insertion of the ions and a volume decrease occurs during disinsertion of the ions. This volume variation has negative impacts on the battery. For example, volume variation may lead to the cracking of the passivation layer which is formed at the electrode surface during the first cycling, which may lead to a loss of capacity and/or electronic conductivity. These negative impacts can be assessed through studies based on scanning electron microscopy (SEM) in situ.

The extent of the volume variation depends on the material. For example, for two batteries different only in anode material, it is noted that volume variation of a carbon or graphite anode is relatively low, generally below 10%, which limits the cracking problems and resulting capacity loss. In contrast, volume variation for a silicon or silicon-based alloy anode is significantly higher, in the order of 300% for a silicon and lithium alloy. This is harmful to the battery. However, the maximum capacity allowed by a carbon anode is around 370 mAh/g, whereas the maximum capacity allowed by a Si—Li alloy anode is higher by a factor of 10. Accordingly, a Si—Li alloy anode allows for a good maximum capacity, but leads to a high volume variation of the material during cycling.

There is a need for an anode allowing for a good maximum capacity while leading to a low volume variation of the material during cycling.

SUMMARY OF THE INVENTION

The inventors have developed an anode allowing for the fabrication of a battery having a capacity similar to Si—Li alloys batteries, and wherein volume variation during cycling remain low.

The anode according to the invention comprises an anode material, a protective material and a current collector. The anode material comprises a mixture of active material which is an alloy of silicon and lithium or silicon oxide and lithium, an electronically conductive agent, and a binder. The current collector is a metal foil.

In the anode according to the invention, the anode material is deposited on the metal foil in the form of a film, and the protective material is deposited on the film of anode material in the form film (protective film). In embodiments of the invention, the anode may comprise more than one protective film.

The present invention also relates to a process for the preparation of the anode, a process for the fabrication of an electrochemical generator, as well as the electrochemical generator so-obtained.

The invention provides the following according to an aspect thereof:

(1) Anode comprising an anode material, a protective material and a current collector.

(2) Anode according to item (1), wherein the anode material is a mixture comprising an active material, at least one electronically conductive agent and a binder.

(3) Anode according to item (2), wherein the active material is an alloy of silicon and lithium or an alloy of silicon oxide and lithium.

(4) Anode according to item (2), wherein the anode material further comprises natural or synthetic graphite.

(5) Anode according to (1) above, wherein the protective material comprises at least one electronically conductive agent and a binder.

(6) Anode according to item (2) or (5), wherein the electronically conductive agent in the anode material and the electronically conductive agent in the protective material independently comprise at least one electronically conductive carbon.

(7) Anode according to item (6), wherein the electronically conductive carbon is selected from: carbon black, acetylene black, carbon fiber such as vapor grown carbon fiber (VGCF) sold by Showa-Denko, carbon nanotubes and graphene.

(8) Anode according to item (2) or (5), wherein the binder in the anode material and the binder in the protective material are independently a polymer.

(9) Anode according to item (2) or (5), wherein the binder in the anode material and the binder in the protective material are independently selected from: polyvinylidene fluoride (PVDF), a copolymer of vinylidene fluoride and hexafluoropropene (PVDV-HFP), a polyimide, natural or synthetic rubber, a carboxymethyl cellulose (CMC), an alginate in acid form or salt form, and a mixture thereof.

(10) Anode according to item (2), wherein the anode material is in the form of particles in the binder, the particles being particles of the active material and particles of the electronically conductive agent.

(11) Anode according to item (5), wherein the protective film is in the form of particles in the binder, the particles being particles of the electronically conductive agent.

(12) Anode according to item (2), wherein the anode material comprises, in mass: 80-95% of the active material, 1-10% of the electronically active conductive agent, and 2-20% of the binder.

(13) Anode according to item (5), wherein the protective material comprises, in mass: 1-20% of the electronically conductive agent and 80-99% of the binder.

(14) Anode according to item (1), wherein the current collector is a foil comprising a metal, preferably aluminum or copper.

(15) Anode according to item (1), wherein the current collector is a foil comprising a metal and carbon, preferably aluminum and carbon.

(16) Anode comprising a metal foil, a film of anode material, and at least one protective film.
(17) Anode comprising a metal foil, a film of anode material deposited on the metal foil, and a protective film deposited on the anode material.
(18) Anode comprising a metal foil, a first protective film deposited on the metal foil, a film of anode material deposited on first protective film, and a second protective film deposited on the film of anode material.
(19) Anode according to item (15) or (18), wherein the metal foil is a copper foil, an aluminum foil or an aluminum and carbon foil.
(20) Anode according to item (17), wherein the metal foil is an aluminum foil, and in a lithium battery when the anode undergoes a cycle, a lithium-aluminum alloy is formed at the interface between the film of anode material and the aluminum foil.
(21) Anode according to item (18), wherein the metal foil is a copper plate.
(22) Anode according to any one of items (15) to (21), wherein the metal foil has a thickness of about 5 to 25 μm, preferably 10 to 15 μm.
(23) Anode according to any one of items (16) to (22), wherein the film of anode material has a thickness of about 5 to 150 μm, preferably 30 to 50 μm.
(24) Anode according to any one of items (16) to (22), wherein the protective film has a thickness of about 1 to 5 μm.
(25) Anode according to item (16) or (17), wherein the anode material comprises an alloy of silicon and lithium or an alloy of silicon oxide and lithium.
(26) Process for the preparation of an anode, comprising the following steps:
  a) preparation of a composition for forming a film of anode material, by mixing, in a first solvent, an active material or a precursor thereof, a first binder and a first electronically conductive agent;
  b) preparation of a composition for forming a protective film, by mixing, in a second solvent, a second electronically conductive agent and a second binder;
  c) deposit, on a metal foil, of the composition for forming the film of anode material, and removal of the first solvent; and
  d) deposit, on the film of anode material, of the composition for forming the protective film, and removal of the second solvent.
(27) Process for the preparation of an anode, comprising the following steps:
  a) preparation of a composition for forming a film of anode material, by mixing, in a first solvent, an active material or a precursor thereof, a first binder and a first electronically conductive agent;
  b) preparation of a composition for forming a protective film, by mixing, in a second solvent, a second electronically conductive agent and a second binder;
  c) deposit, on a metal foil, of the composition for forming the protective film thereby forming a first protective film, and removal of the second solvent;
  d) deposit, on the first protective film, of the composition for forming the film of anode material, and removal of the first solvent; and
  e) deposit, on the film of anode material, of the composition for forming the protective film, and removal of the second solvent.
(28) Process according to item (26) or (27), wherein step a) is performed before or after step b).
(29) Process according to item (26) or (27), wherein the removal of first solvent or the second solvent is performed by heat treatment, preferably under vacuum.
(30) Process according to item (26) or (27), further comprising a step of compressing the element obtained.
(31) Process according to item (26) or (27), wherein selection of the first solvent is based on the first binder.
(32) Process according to item (26) or (27), wherein selection of the second solvent is based on the second binder.
(33) Process according to item (26) or (27), wherein the first solvent and the second solvent are independently selected from: N-methylpyrrolidone (NMP), cyclopentanone, and water.
(34) Process according to item (26) or (27), wherein the first binder and the second binder are independently selected from: polyvinylidene fluoride (PVDF), a polyimide, natural or synthetic rubber, a carboxymethyl cellulose (CMC), an alginate in acid or salt form, and a mixture thereof.
(35) Process according to item (26) or (27), wherein the first solvent and the second solvent are independently N-methylpyrrolidone (NMP) or cyclopentanone; and the first and second binder are independently PVDF or a polyimide.
(36) Process according to item (26) or (27), wherein the first and second solvents are each water; and the first and second binders are independently natural or synthetic rubber, a carboxymethyl cellulose (CMC), or an alginate.
(37) Process according to item (26) or (27), wherein the precursor of active material used for the preparation of the composition for forming the film of anode material is a powder of silicon, a powder of silicon oxide or a powder Si—Li alloy.
(38) Process according to item (26) or (27), wherein the composition for forming the film of anode material comprises, in mass, about 5 to 20 parts of the first solvent, and about 80 to 95 parts of a mixture comprising, in mass: 80-95% of the precursor of active material, 2-20% of the first binder, and 1-10% of the electronically conductive carbon.
(39) Process according to item (17) or (18), wherein the composition for forming the protective film comprises, in mass, about 5 to 20 parts of the second solvent, and about 80 to 95 parts of a mixture comprising, in mass: 1-20% of the electronically conductive carbon, and 80-99% of the second binder.
(40) Battery comprising an anode as defined in any one of items (1) to (25).
(41) Use of an anode as defined in any one of items (1) to (25), in the fabrication of a battery.
(42) Process for the fabrication of a battery comprising a process as defined in any one of items (26) to (39).
(43) Battery according to item (40), which is a lithium battery.
(44) Use according to item (41), wherein the battery is a lithium battery.
(45) Process according to item (42), wherein the battery is a lithium battery.

Other advantages of the present invention will become more apparent upon reading of the following embodiments thereof, given by way of example only with reference to the accompanying drawings.

DESCRIPTION OF ILLUSTRATIVE EMBODIMENTS

Figure 1:
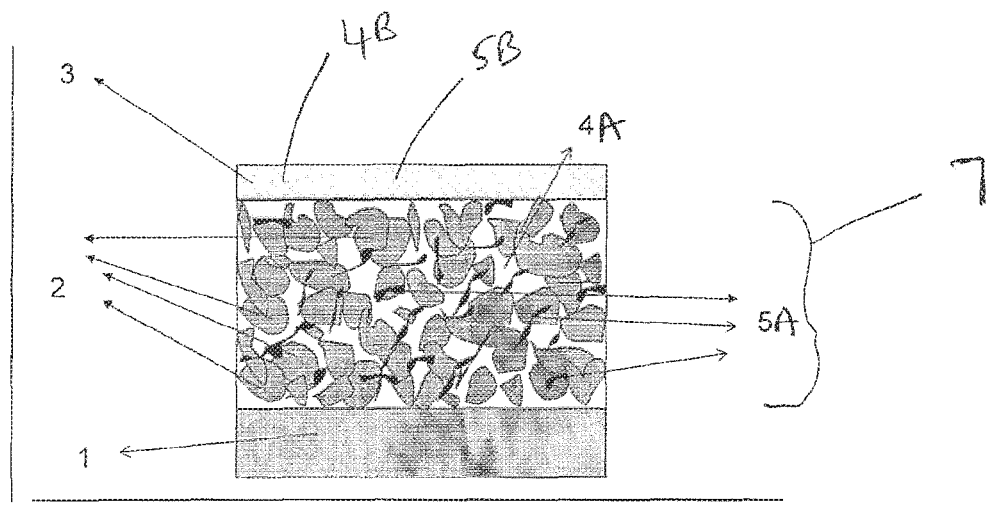
FIG. 1 illustrates an anode according to the invention.

An anode according to the invention is illustrated in FIG. 1. The anode comprises a current collector 1, a film of anode material 7 and a protective film 3. The film of anode material 7 comprises, in a binder 4A, particles of active material 2 and particles of at least one electronically conductive agent 5A.

Figure 2:
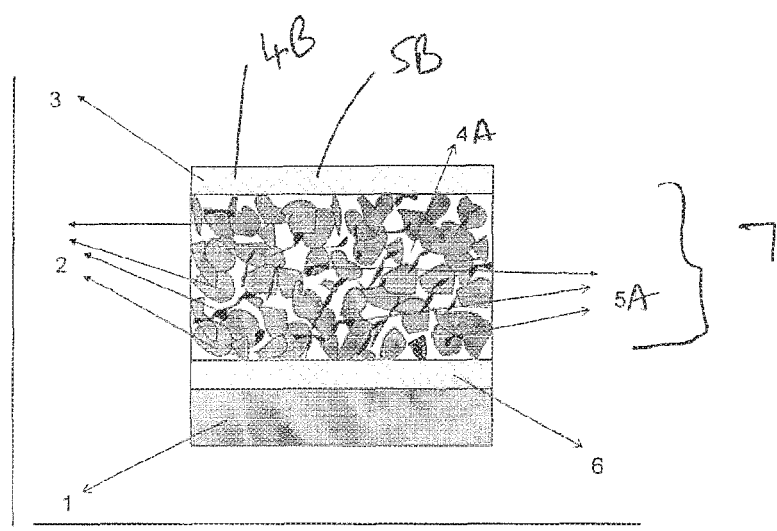
FIG. 2 illustrates an embodiment of the anode according to the invention.

In an embodiment of the invention as illustrated for example in FIG. 2, the anode comprises two protective films 3, 6. The protective films 3, 6 may be identical or different.

The current collector 1 may be a copper or aluminum foil. When the current collector is an aluminum foil, an alloy of aluminum and lithium (Al—Li) is formed during cycling at the interface between the anode material film and the aluminum foil. This phenomenon is advantageous as it limits volume variation of the anode material during insertion/disinsertion of lithium ions.

When the current collector 1 is a copper foil, in an embodiment of the invention as illustrated for example in FIG. 2, the anode comprises two protective films 3, 6, the film of anode material 7 being located between the two protective films. This arrangement given that copper does not form an alloy with lithium or silicon.

The anode material 7 is a mixture comprising particles of active material 2 which is a silicon and lithium alloy or a silicon oxide and lithium alloy, particles of at least one electronically conductive agent 5A, and a binder 4A.

The electronically conductive agent 5A is an electronically conductive carbon selected from carbon black, acetylene black, carbon fibers, carbon nanotubes and graphene. The carbon fibers may be carbon fibers such as vapor grown carbon fiber (VGCF) sold by Showa-Denko.

According to an embodiment of the invention, the anode material 7 further comprises natural or synthetic graphite. The mass ratio active material/graphite may be around 1/1.

According to an embodiment of the invention, the electronically conductive agent 5A comprises VGCF fibers and another electronically conductive carbon. The mass ratio VGCF/other electronically conductive carbon may be around 1/1.

The binder 4A is a polymer. For example, the binder may be polyvinylidene fluoride (PVDF), a copolymer of vinylidene fluoride and hexafluoropropene (PVDV-HFP), a polyimide, a carboxymethyl cellulose (CMC), an alginate in acid or salt form, or a mixture thereof. The alginate cation may be for example Na, Li, K, Ca, Mg, Al or $NH_4$.

The protective film 3, 6 comprises particles of at least one electronically conductive agent 5B and a binder 4B. The electronically conductive agent 5B and the binder 4B are as described above for the anode material 7.

The electronically conductive agent in the anode material 5A and the electronically conductive agent in the protective film 5B may be identical or different. These electronically conductive agents are independently selected from: carbon black, acetylene black, carbon fibers, carbon nanotubes and graphene. The carbon fibers may be carbon fibers such as vapor grown carbon fiber (VGCF) sold by Showa-Denko.

According to an embodiment of the invention, the electronically conductive agent in the anode material 5A and the electronically conductive agent in the protective film 5B are identical.

According to an embodiment of the invention, the binder in the anode material 4A and the binder in the protective film 4B are identical.

According to an embodiment of the invention, the amounts, in mass, of constituents in the anode material 7 are as follows:
- active material: 80-95%
- electronically conductive agent: 1-10%
- binder: 2-20%.

According to an embodiment of the invention, the amounts, in mass, of constituents in the protective film 3, 6 are as follows:
- electronically conductive agent: 1-20%
- binder 80-99%.

According to an embodiment of the invention, the film of anode material 7 has a thickness of about 5 to 150 μm, preferably 30 to 50 μm; the metal foil which is the current collector 1 has a thickness of about 1 to 25 μm, preferably 10 to 15 μm; and each of the protective films 3, 6 has a thickness of about 1 to 5 μm.

Process for the Preparation of the Anode

An anode according to the invention may be prepared by a process comprising the following steps:
a) preparation of a composition for forming the film of anode material 7, by mixing, in a solvent, an active material or a precursor thereof, a binder and an electronically conductive agent;
b) preparation of a composition for forming the protective film 3, 6, by mixing, in a solvent, an electronically conductive agent and a binder;
c) deposit, on a metal foil, of the composition for forming the protective film, and removal of the solvent; and
d) deposit, on the film of anode material, of the composition for forming the protective film, and removal of the solvent.

According to an embodiment of the invention, preparation of the composition for forming the protective film 3, 6 (step b)) may be performed before the preparation of the composition for forming the film of anode material 7 (step a)).

When the anode comprises a protective film 6 between the current collector 1 and the film of anode material 7 (FIG. 2), the process comprises step b') which consists of preparing a composition for forming the protective film 6, depositing the composition on a metal foil which is the current collector and removing the solvent, the deposit at step c) being on the surface of the protective film 6, before carrying out step d).

Selection of the solvent used for the preparation of the composition for forming the film of anode material 7 depends on the binder 4A. According to an embodiment of the invention, N-methylpyrrolidone (NMP) or cyclopentanone is used when the binder is PVDF or a polyimide.

Water may be used as solvent when the binder is natural or synthetic rubber, a carboxymethyl cellulose (CMC) or an alginate.

The precursor of active anode material in the composition for forming the film of anode material 7 is a powder of silicon, silicon oxide or Si—Li alloy. According to an embodiment of the invention, the composition for forming the film of anode material may comprise, in mass, about 5 to 20 parts of a solvent, and about 80 to 95 parts of a mixture of, in mass: 80-95% of precursor of active material, 2-20% of binder, and 1-10% of electronically conductive carbon.

Selection of the solvent used to prepare the composition for forming the protective film 3, 6 depends on the binder 4B. According to an aspect of the invention, N-methylpyrrolidone (NMP) or cyclopentanone is used when the binder is PVDF or a polyimide. Water may be used as solvent when the binder is natural or synthetic rubber, a carboxymethyl cellulose (CMC) or an alginate. The composition for forming the protective film 3, 6 may comprise, in mass, about 5 to 20 parts of a solvent, and about 80 to 95% of a mixture of, in mass: 1-20% of electronically conductive carbon, and 80-99% of the binder.

Deposition of the various compositions, namely, the composition for forming the film of anode material 7 and the composition for forming the protective film 3, 6, may be performed by techniques known in the art. For example, deposition may be performed using the Doctor Blade technique or by extrusion technique.

A composition for forming for forming one of the films of anode material is deposited, either on the current collector, or on another film already deposited, then submitted to heat treatment to remove the solvent. According to an embodiment of the invention, heat treatment is performed under vacuum. The temperature during heat treatment depends on the boiling point of the binder used. The temperature may be for example around 120° C. when the binder is PVDF or CMC, or around 150° C. when the binder is a polyimine.

The preparation of an anode according to the invention and as illustrated for example in FIG. 1 comprises two deposit and drying steps (deposit of a composition followed by drying of the composition). The first step is for the film of anode material 7 and the second step is for the protective film 3.

The preparation of the anode according to the invention and as outlined for example in FIG. 2 comprises three deposit and drying steps (deposit of a composition followed by drying of the composition). The first step is for the protective film 6, the second step is for the film of anode material 7 and the third step is the second protective film 3.

After removal of the solvent in all the films, the element obtained is compressed in order to suppress roughness and increase the density of the anode material. According to an embodiment of the invention, a preferred density of the anode material is around at least 1.3 g/cm$^3$.

Use of the Anode in a Lithium Ion Battery

An anode according to the invention is useful in a lithium ion battery in which the cathode comprises an electrode material deposited on a current collector and the electrolyte comprises a lithium salt in a solvent, the solvent being for example a liquid solvent, a polymer solvent or a gel solvent.

Cathode:

The current collector of the cathode is preferably an aluminum film. The cathode material comprises a positive active electrode material, eventually an ionically conductive agent and eventually a binder. Selection of the positive active electrode material, the eventual binder and the eventual ionically conductive agent is apparent to a skilled person.

The positive active electrode material may be selected from vanadium oxides $VO_x$ (2≤x≤2.5), $LiV_3O_8$, $Li_yNi_{1-x}Co_xCo_2$ (0≤x, y≤1), manganese spinels $Li_yMn_{1-x}M_xO_2$ (M=Cr, Al, V, Ni, 0≤x≤0.5; 0≤y≤2), organic polydisulfides, FeS, $FeS_2$, iron sulphate $Fe_2(SO_4)_3$, iron and lithium phosphates and phosphosilicates having an olivine structure, or corresponding products in which iron is substituted by manganese.

The binder in the positive electrode material may be for example a polymer selected among the polymers defined above as binder for the anode material.

The electronically conductive agent in the cathode material may be carbon black, black acetylene, carbon fiber, or carbon nanotubes.

Electrolyte:

The lithium salt of the electrolyte may be selected from lithium halides LiX (X=Cl, Br, I or $I_3$), lithium perfluorosulfonate ($C_nF_{2n}SO_3Li$), lithium (trifluoromethylsulfonyl)imide ($NCF_3SO_2)_2)Li$, lithium bis(trifluoromethylsulfonyl)methylide ($HC(CF_3SO_2)_2)Li$, lithium bis(fluorosulfonyl)imide (LiFSI), lithium tris(trifluoromethylsulfonyl)methylide ($C(CF_3SO_2)_3)Li$, lithium perchlorate ($LiClO_4$), lithium hexafluoroarseniate ($LiAsF_6$), lithium heaxafluorophosphate ($LiPF_6$), lithium hexafluoroantimonate ($LiSbF_6$) and lithium tetrafluoroborate ($LiBF_4$), lithium dicyanotriazolate (LiDCTA) and lithium 4,5-dicyano-2-(trifluoromethyl)imidazolate (LiTDI).

When the electrolyte is a liquid electrolyte, the solvent may be selected from organic aprotic polar liquids, ionic liquids, or mixtures thereof.

Examples of aprotic polar liquids are linear and cyclic ethers, esters, nitriles, nitro derivatives, amides, sulfones, sulfonates, alkylsulfamides, and partially hydrogenated hydrocarbons. Preferred solvents are for example diethyl ether, dimethoxyethane, glyme, tetrahydrofuran, dioxane, dimethyltetrahydrofurane, methyl or ethyl formiate, propylene or ethylene carbonate, alkyl carbonates (such as dimethyl carbonate, diethyl carbonate and methylpropyl carbonate), butyrolactones, acetonitrile, nitromethane, nitrobenzene, dimethylformamide, diethyl formamide, vinyl carbonate, dimethyl sulfone, sulfone tetramethylene, and tetralkylsulfonamides having 5 to 10 carbon atoms.

Ionic liquids are ionic compounds that are in liquid form at the temperature of use. In particular, such compounds are ionic compounds having an anion and a cation, in which:

the anion may be selected from Cl, Br, I, $BF_4^-$, $R_fBF_3^-$, $PF_6^-$, $N(CN)_2^-$, $C(CN)_3^-$, $[(C_2O_4)_2B]^-$, $RSO_3^-$, $ROSO_3^-$, $[RPO_2]^-$, $[R(R'O)PO_2]^-$, $[(RO)_2PO_2]^-$, $R_fPF_5^-$, $(R_f)_2PF_4^-$, $(R_f)_3PF_3^-$, $R_fCO_2^-$, $R_fSO_3^-$, $[(R_fSO_2)_2N]^-$, $[(R_fSO_2)_2CH]^-$, $[(R_fSO_2)_2C(CN)]^-$, $[R_fSO_2C(CN)_2]^-$, $[(R_fSO_2)_3C]^-$, wherein R and R' are identical or different and each represents an alkyl having from 1 to 12 carbon atoms, aryl, alkylaryl, and $R_f$ is F, $CF_3OCF_2$, $HCF_2CF_2$, $C_6F_5$ or a perfluoroalkyl having from 1 to 8 carbon atoms;

the cation is a ammonium, phosphonium, sulfonium, iodonium, pyridinium, imidazolium, pyrazolium, acetamidinium, oxazolium, thiazolium, pyrrolidinium, piperidinium, imidazolinium ou guanidinium.

Preferably, ionic liquid compounds are 1-ethyl-3-methylimidazolium bis-(trifluoromethanesulfonyl)imide (EMI-TFSI), 1-ethyl-3-methylimidazolium bis(fluorosulfonyl)imide (EMI-FSI), N-methyl-N-propylpyrrolidinium bis (fluorosulfonyl)imide (Py13-FSI), and N-butyl-N-methylpyrrolidinium bis(fluorosulfonyl)imide (Py14-FSI).

When the electrolyte is a polymer electrolyte, the solvent may be selected from solvating polymers, crosslinked or not, having grafted ionic groups or not. A solvating polymer is a polymer having solvating units including at least one heteroatom selected from sulfur, oxygen, nitrogen and fluorine. Examples of solvating polymers are polyethers having a linear structure, a comb structure or a block structure, forming a network or not, polymers based on poly(ethylene oxide), or copolymers including ethylene oxide pattern or propylene oxide pattern or allylglycidylether pattern, polyphosphazenes, crosslinked networks based on polyethylene glycol crosslinked by isocyanates or networks obtained by polycondensation and bearing groups that allow for incorporation of groups that can be crosslinked. Solvating polymers may also be block copolymers in which certain blocks bear functions having redox properties. Preferred solvating polymers are polyethers, more preferred solvating polymers are polyethers having at least three branches.

When the electrolyte is a gel electrolyte, the solvent of the lithium salt comprises simultaneously a liquid solvent selected from the liquid solvents listed above and a polar polymer solvent comprising units including at least one heteroatom selected from sulfur, oxygen, nitrogen and fluorine. Examples of such polymer are polymers including mainly units derived from acrylonitrile, vinylidene fluoride, N-vinylpyrrolidone or methyl methacrylate. These polymers may include ionic groups. The amount of liquid in the solvent may vary from 2% (which corresponds to a plasticized solvent) to 98% (which corresponds to a gelled solvent).

An electrochemical generator in which the anode is an anode according to the invention is assembled preferably under inert atmosphere.

EXAMPLES

The present invention is illustrated by way of the following examples; however, the invention is not limited to these examples. The following materials were used:
- aluminum foil having a thickness of 12 μm;
- copper foil having a thickness of 12 μm;
- $SiO_x$ particles (x≈0.95) having an average size of ≈7 μm and coated with carbon film having a thickness of ≈1 nm (herein below SiOC);
- polyimide;
- water dispersible synthetic rubber from the company Zeon (herein below SR);
- water dispersible carbomethoxycellulose (herein below CMC);
- vinylidene polyfluoride from the company Kureha (herein below PVDF Kureha 10%);
- particles of natural graphite having an average diameter of 12 μm, sold by the company Osaka Gas under the denomination OMAC (herein below OMAC);
- carbon fibers sold by the company Showa Denko under the denomination VGCF-H® (herein below VGCF-H®);
- acetylene black sold by the company Denka (herein below AB).

Example 1: Preparation of the Anode (Polyimide Binder)

Three anodes were prepared according to the process outlined below.

Composition for Forming the Film of Anode Material

A composition for forming the film of anode material was prepared. The constituents of the anode material are outlined in Table 1 below. The composition for forming the anode material comprises N-methylpyrrolidone (NMP) as solvent. In the composition for forming the anode material, the amount of NMP is about 81.28 g.

The composition for forming the anode material was prepared by dissolving the polyimide in NMP, then adding the two active materials (SiOC and OMAC) and the electronically conductive carbon (VGCF-H®).

TABLE 1

| Ex. | Current collector | AM* | AM* (%) | AM* (%) | VGCF-H® (%) | Binder | (%) |
|---|---|---|---|---|---|---|---|
| a | copper | SiOC OMAC | 40.74 40.74 | 81.48 | 3.4 | polyimide | 15.12 |
| b | copper | SiOC OMAC | 40.74 40.74 | 81.48 | 3.4 | polyimide | 15.12 |
| c | copper | SiOC OMAC | 48.89 32.58 | 81.47 | 3.39 | polyimide | 15.14 |

*Active material

Composition for Forming the Protective Film

The composition for forming the protective film was prepared. The constituents of the protective film are outlined in Table 4 below. The composition for forming the protective film comprises water as solvent. In the composition for forming the protective film, the amount of water is about 75.42 g.

The composition for forming the protective film was prepared by adding SR and CMC in water, then dispersing AB and VGCF-H® in the suspension SR+CMC in water.

Preparation of the Anode

The composition for forming the film of anode material was deposited on a current collector using the Doctor Blade technique, and a heat treatment was performed at 150° C. for 12 hours under vacuum to remove the solvent. The current collector is a copper foil as indicated in Table 1.

After the heat treatment, the composition for forming the film protector was deposited on the film of anode material using the Doctor Blade technique. Heat treatment was then performed at 120° C. for 12 hours under vacuum to remove water.

The multilayer element thus obtained was compressed to remove roughness yielding a material having a density of 1.3 $g/cm^3$.

Example 2: Preparation of the Anode (SR+CMC as Binder)

Three anodes were prepared following the process outlined below.

Composition for Forming the Film of Anode Material

A composition for forming the film of anode material was prepared. Constituents of the anode are outlined in Table 3 below. The composition for forming the film of anode material comprises the constituents of the anode material as outlined in Table 1 and water. In the composition for forming the film of anode material, the amount of water is about 17.67 g. The amounts of SR and CMC are about 3.47 g and 2.78 g, respectively.

According to an embodiment of the invention, it is possible to adjust the amount of water in the composition for forming the film protector. For example, an increase of the amount of water may facilitate the application of the film.

TABLE 3

| Ex. | Current collector | AM* | % | VGCF-H® (%) | Binder | (%) | AM* (%) |
|---|---|---|---|---|---|---|---|
| d | copper | SiOC | 44.859 | 3.738 | SR | 3.662 | 89.718 |
|   |   | OMAC | 44.859 |   | CMC | 2.879 |   |
| e | aluminum PT402 | SiOC | 44.859 | 3.738 | SR | 3.662 | 89.718 |
|   |   | OMAC | 44.859 |   | CMC | 2.879 |   |
| f | aluminum PT402 and carbon | SiOC | 44.859 | 3.738 | SR | 3.662 | 89.718 |
|   |   | OMAC | 44.859 |   | CMC | 2.879 |   |

*Active material

The composition for forming the film of anode material was prepared by dispersing SR+CMC in water, then adding the active material and the electronically conductive agent.

Composition for Forming the Protective Film

A composition for forming the protective film was prepared. The constituents of the protective film are outlined in Table 4 below.

TABLE 4

| Ex. | AB | VGCF-H® (%) | Binder | (%) |
|---|---|---|---|---|
| d | 5.039 | 5.039 | PVDF Kureha 10% | 89.926 |
| e | 5.037 | 5.037 | PVDF Kureha 10% | 89.926 |
| f | 5.037 | 5.037 | PVDF Kureha 10% | 89.926 |

The composition for forming the protective film was prepared by adding PVDF in the solvent then dispersing AB and VGCF-H® in the PVDF solution.

The composition for forming the anode material was deposited on a current collector using the Doctor Blade technique, then submitted to heat treatment at 150° C. for 12 hours under vacuum to remove the solvent. The current collector is a copper foil as indicated in Table 1.

After heat treatment, the composition for forming the protective film was deposited on the film of anode material, using the Doctor Blade technique. Then heat treatment was performed at 120° C. for 12 hours under vacuum to remove water.

The multilayer element so-obtained was compressed to suppress roughness and a material having a density of 1.3 g/cm$^3$ was obtained.

Example 3: Characterization of the Anodes

The anodes d, e were used as working electrode in an electrochemical cell in which:

The reference electrode comprises: a lithium metal electrolyte.

The electrolyte is LiPF$_6$ (1 mole) in EC-DEC (3/7 volume/volume) and VC (2% wt).

EC-DEC: Ethylene Carbonate-Diethyl carbonate.

VC: Vinyl Carbonate.

Figure 4:
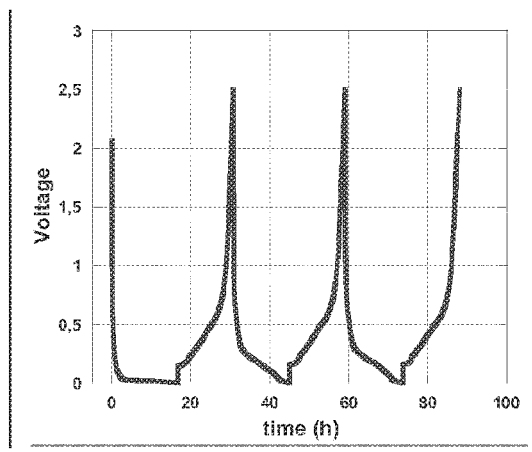
FIG. 4 illustrates a discharge/charge curve of a battery comprising an embodiment of the anode according to the invention without the protective film.

For a comparison, a sample without the protective film was tested (FIG. 4).

Each electrochemical cell was submitted to successive charge/discharge cycles with a C/24 regimen (discharge in 24 hours) in galvanostatic mode between 10 mV and 2.5 V at 25° C.

For each cell, the following were determined:

The reversible capacity at the 1$^{st}$ cycle, in mAh/g

The coulombic efficiency during the 1$^{st}$ cycle (C. Effi. 1) and during the second cycle (C. Eff. 2).

Results obtained are outlined in Table 5 below.

TABLE 5

| Battery | Anode | Reversible capacity (mA/hg) | Coulombic efficiency 1 (%) | Coulombic efficiency 2 (%) |
|---|---|---|---|---|
| 1200B | d | 892 | 85 | 97 |
| 1200D | d (without protective film) | 536 | 83 | 97 |
| 1202D | e | 1973 | 83 | 98 |
| 1202E | f | 1236 | 82 | 73 |

Comparison of the 1200B and 1200D cells shows that the presence of the protective film significantly increases the reversible capacity. This is a sign of a decrease of the volume expansion during the insertion of lithium ions in the anode material, without decreasing the coulombic efficiency 1 and the coulombic efficiency 2.

Comparison of the 1200B, 1202D and 1202E cells shows that use of an aluminum or aluminum+carbon current collector significantly increases the reversible capacity comparing to use of a copper current collector, without a real change on the coulombic efficiency 1 and the coulombic efficiency 2.

Figure 3:
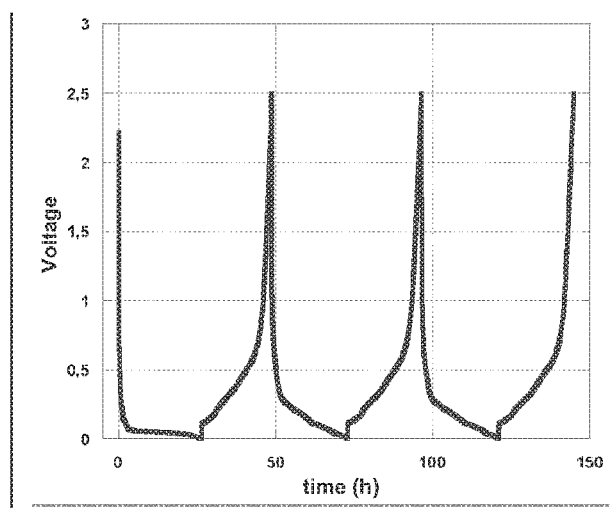
FIG. 3 illustrates a discharge/charge curve of a battery comprising an embodiment of the anode according to the invention with the protective film.
Figure 5:
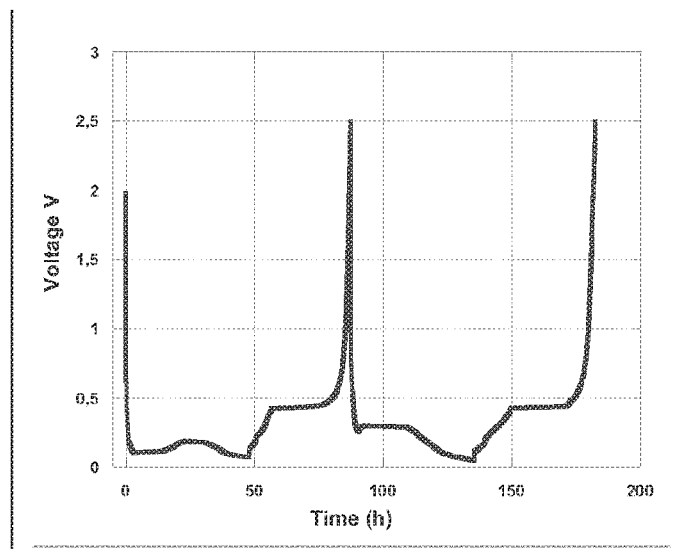
FIG. 5 illustrates a discharge/charge curve of a battery comprising an embodiment of the anode according to the invention with the protective film.
Figure 6:
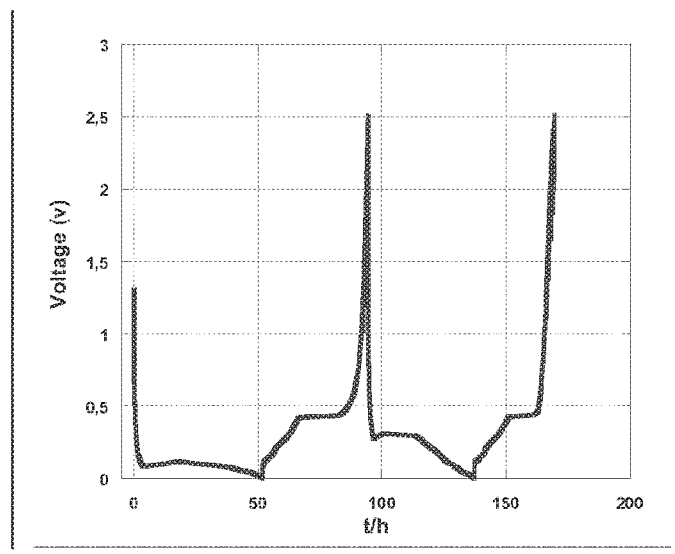
FIG. 6 illustrates a discharge/charge curve of a battery comprising an embodiment of the anode according to the invention with the protective film.

FIGS. 3, 4 and 5 represent charge/discharge curves of the first three cycles, for the cells, 1200B, 1200D, 1202D and 1202E, respectively.

The scope of the claims should not be limited by the preferred embodiments set forth in the examples, but should be given the broadest interpretation consistent with the description as a whole.

The invention claimed is:

1. An anode comprising:
   a layer of an anode material,
   a layer of a protective material, and
   a current collector,
   wherein the anode material is a mixture comprising:
      an active material,
      at least one electronically conductive agent, and
      a binder, and
   wherein the active material is an alloy of silicon and lithium or the active material comprises silicon oxide and lithium,
   wherein the binder in the anode material is a polymer,
   wherein, in the anode material, the active material and the at least one electronically conductive agent are in the form of particles in the binder,
   wherein the anode material comprises, in mass: 80-95% of the active material, 1-10% of the electronically active conductive agent, and 2-20% of the binder,
   wherein the protective material comprises:
      at least one electronically conductive agent, and
      a binder.

2. The anode according to claim 1, wherein the electronically conductive agent in the anode material comprises natural or synthetic graphite.

3. The anode according to claim 1, wherein the electronically conductive agent in the anode material comprises at least one electronically conductive carbon, wherein the electronically conductive carbon is selected from the group consisting of carbon black, acetylene black, carbon fiber, carbon nanotubes and graphene.

4. The anode according to claim 1, wherein the binder in the anode material is selected from the group consisting of polyvinylidene fluoride (PVDF), a copolymer of vinylidene fluoride and hexafluoropropene (PVDV-HFP), a polyimide, natural or synthetic rubber, a carboxymethyl cellulose (CMC), an alginate in acid form or salt form, and a mixture thereof.

5. The anode according to claim 1, wherein the current collector is a foil comprising a metal which is aluminum or copper.

6. The anode according to claim 1, wherein the current collector is a foil comprising aluminum and carbon.

7. The anode according to claim 1, wherein the current collector comprises a metal foil.

8. The anode according to claim 7, wherein the layer of anode material is deposited on the metal foil current collector and the layer of protective material is deposited on the layer of anode material; and wherein the metal foil is an aluminum foil.

9. The anode according to claim 7, wherein the metal foil current collector has a thickness of about 5 to 25 µm, and/or the layer of anode material has a thickness of about 5 to 150 µm, and/or the layer of protective material has a thickness of about 1 to 5 µm.

10. A battery comprising the anode according to claim 1.

11. An anode comprising:
   a layer of an anode material,
   a layer of a protective material, and
   a current collector,
   wherein the anode material is a mixture comprising:
      an active material,
      at least one electronically conductive agent, and
      a binder, and
   wherein the protective material comprises:
      at least one electronically conductive agent, and
      a binder, and
   wherein, in the protective material, the at least one electronically conductive agent is in the form of particles in the binder,
   wherein the protective material comprises, in mass:
      1-20% of the electronically conductive agent and
      80-99% of the binder.

12. The anode according to claim 11, wherein the electronically conductive agent in the protective material comprises at least one electronically conductive carbon, wherein the electronically conductive carbon is selected from the group consisting of carbon black, acetylene black, carbon fiber, carbon nanotubes and graphene.

13. The anode according to claim 11, wherein the binder in the protective material is a polymer, wherein the binder is selected from the group consisting of polyvinylidene fluoride (PVDF), a copolymer of vinylidene fluoride and hexafluoropropene (PVDV-HFP), a polyimide, natural or synthetic rubber, a carboxymethyl cellulose (CMC), an alginate in acid form or salt form, and a mixture thereof.

14. The anode according to claim 11, wherein the active material in the protective material is an alloy of silicon and lithium or the active material comprises silicon oxide and lithium.

* * * * *